(12) United States Patent
Sumiyama

(10) Patent No.: US 8,477,315 B2
(45) Date of Patent: Jul. 2, 2013

(54) VOLUME HOLOGRAM, LIGHT SOURCE DEVICE, ILLUMINATION DEVICE, MONITOR, AND IMAGE DISPLAY DEVICE

(75) Inventor: Fumika Sumiyama, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 789 days.

(21) Appl. No.: 12/068,194

(22) Filed: Feb. 4, 2008

(65) Prior Publication Data

US 2008/0192259 A1 Aug. 14, 2008

(30) Foreign Application Priority Data

Feb. 9, 2007 (JP) ................................. 2007-030087
Dec. 26, 2007 (JP) ................................. 2007-334298

(51) Int. Cl.
*G01B 9/021* (2006.01)

(52) U.S. Cl.
USPC ........................................................ 356/458

(58) Field of Classification Search
USPC ............................ 356/457, 458; 359/590, 569
See application file for complete search history.

(56) References Cited

U.S. PATENT DOCUMENTS

| | | | |
|---|---|---|---|
| 5,877,874 A * | 3/1999 | Rosenberg | 359/15 |
| 6,975,294 B2 | 12/2005 | Manni et al. | |
| 7,298,771 B2 * | 11/2007 | Volodin et al. | 372/102 |
| 2002/0012377 A1 * | 1/2002 | Suganuma et al. | 372/98 |
| 2005/0248820 A1 * | 11/2005 | Moser et al. | 359/15 |
| 2006/0023173 A1 * | 2/2006 | Mooradian et al. | 353/94 |
| 2006/0023757 A1 | 2/2006 | Mooradian et al. | |
| 2006/0215972 A1 * | 9/2006 | Volodin et al. | 385/100 |
| 2006/0228073 A1 * | 10/2006 | Mukawa et al. | 385/31 |
| 2006/0268241 A1 | 11/2006 | Watson et al. | |
| 2006/0280219 A1 | 12/2006 | Shchegrov | |
| 2007/0153862 A1 | 7/2007 | Shchegrov et al. | |
| 2007/0153866 A1 | 7/2007 | Shchegrov et al. | |
| 2008/0225361 A1 * | 9/2008 | Kasazumi et al. | 359/15 |

FOREIGN PATENT DOCUMENTS

| | | |
|---|---|---|
| JP | A-03-204678 | 9/1991 |
| JP | A-10-097169 | 4/1998 |
| JP | A-2001-510902 | 8/2001 |
| JP | A 2001-284718 | 10/2001 |
| JP | A-2001-284719 | 10/2001 |
| JP | A 2004-503923 | 2/2004 |
| JP | A-2007-011057 | 1/2007 |

OTHER PUBLICATIONS

Mooradian A. et al., "High Power Extended Vertical Cavity Surface Emitting Diode Lasers and Arrays and their Applications," Nov. 2, 2005, Micro-Optics Conference, pp. 1-4.
"Volume Holographic Gratings (VHG)," Ondax Inc., 2005, pp. 1-7.

* cited by examiner

*Primary Examiner* — Tarifur Chowdhury
*Assistant Examiner* — Jonathan Hansen
(74) *Attorney, Agent, or Firm* — Oliff & Berridge, PLC

(57) ABSTRACT

A volume hologram includes: an incidence surface onto which coherent light having a plurality of wavelengths is incident; and a plurality of interference fringes having streaks so that the angles between the streaks and the incidence surface are different from each other and so that the each interference fringe corresponds to one wavelength of the coherent light.

20 Claims, 8 Drawing Sheets

VOLUME HOLOGRAM, LIGHT SOURCE DEVICE, ILLUMINATION DEVICE, MONITOR, AND IMAGE DISPLAY DEVICE

CROSS-REFERENCE TO RELATED APPLICATION

This application is based on and claims priority from Japanese Patent Application No. 2007-030087, filed on Feb. 9, 2007, and Japanese Patent Application No. 2007-334298, filed on Dec. 26, 2007, the contents of which are incorporated herein by reference.

BACKGROUND

1. Technical Field

The present invention relates to a volume hologram, a light source device, an illumination device, a monitor, and an image display device, particularly, a light source device supplying laser light.

2. Related Art

In recent years, using a laser light source that supplies laser light for use in a monitor or an image display device has been suggested.

Compared with a UHP lamp that is conventionally used as the light source device for a monitor or image display device, the light source device using the laser light source includes the advantages of high the color reproducibility, instantaneous lighting, long service life, and the like.

When the coherent laser light is irradiated onto a diffusing surface, an interference pattern called a speckle pattern, where light points and dark points are randomly distributed may be generated.

The speckle pattern is generated because the lights which are diffused by the diffusing surface at each point of the diffusing surface randomly interfere with each other.

When an image is displayed and a viewer watches the image with the speckle pattern, such as a garish flicker, generated from the image, the viewer may be annoyed.

Therefore, when using the laser light source, it is necessary to take countermeasures to prevent the speckle noise.

A countermeasure for preventing speckle noise, for example, as suggested in Published Japanese Translation No. 2004-503923 of PCT International Publication, is a technique where a plurality of emission elements is arrayed which supplies laser light whose wavelengths are different from each other.

Since the coherence length of laser light is substantially in inverse proportion to the spectral band width of laser light, the speckle noise is reduced and the coherence length is shortened by expanding the spectral band width.

Furthermore, by using an external resonator resonating laser light, a laser light source emits laser light with a high power.

As disclosed in Japanese Unexamined Patent Application, First Publication No. 2001-284718, for example, a technique using a volume hologram as the external resonator has been suggested.

By using the volume hologram, it is possible to produce laser light with narrow band width.

When an external resonator is included in the constitution, in order to oscillate laser light, it is necessary to use a resonance mirror having a high wavelength selectivity.

Even if a wide spectral bandwidth is obtained while emitting laser light from the emission element, the bandwidth of the laser light narrows in the external resonator.

When the bandwidth of laser light narrows in the external resonator, it is difficult to reduce speckle noise.

In contrast, in order to widen the wavelength-bandwidth of laser light when the selective wavelength-bandwidth of resonance mirror is widened, it is difficult to resonate the laser light, therefore the external resonator will be nonfunctional.

Furthermore, when a volume hologram is used, the wavelength-bandwidth of light can be on the very narrow sub nano-meter order.

When the bandwidth of light is narrowed as described above, though the characteristic of laser light is improved, there is disadvantage in that it is difficult to reduce speckle noise.

Additionally, in order to resonate laser light, whose wavelengths are different from each other, volume holograms corresponding to the emission elements which are disposed in an array may be used.

However, in this case, since alignment between all of the emission elements and all of the volume holograms is necessary, it is extremely difficult to assemble the light source device.

As described above, there is a problem in that it is difficult to reduce speckle noise in a conventional constitution where an external resonator is used.

SUMMARY

An advantage of some aspects of the invention is to provide a light source device, an illumination device, a monitor, and an image display device, where it is possible to reduce speckle noise in constitutions where an external resonator is used.

A first aspect of the invention provides a volume hologram including: an incidence surface onto which coherent light having a plurality of wavelengths is incident; and a plurality of interference fringes having streaks so that the angles between the streaks and the incidence surface are different from each other and so that the each interference fringe corresponds to one wavelength of the coherent light.

According to the volume hologram of the first aspect of the invention, even if the distances (intervals) between the streaks of the interference fringes are the same, the optical distance of the light varies based on the angles between the steaks of interference fringes and the incidence surface since the interference fringes are formed (recorded) so that the angles between the steaks and the incidence surface correspond to each wavelength of the coherent light which is incident into the volume hologram.

In this constitution, light whose wavelengths correspond to the interference fringes (each wavelength corresponds to one interference fringe) is emitted from the volume hologram.

Therefore, the spectral bandwidth of the wavelength-bandwidth of the light which has passed through the volume hologram is expanded.

Thus, the light having a wide spectral bandwidth is output from the volume hologram. Thus, it is possible to reduce the speckle noise included in the light emitted from the volume hologram.

It is preferable that, in the volume hologram of the first aspect of the invention, the interference fringes include at least a first interference fringe having first streaks, a second interference fringe having second streaks, and a third interference fringe having third streaks. In this constitution, the angles between the incidence surface and each of the first streaks, the second streaks, and the third steaks are different from each other, and the angle between the first streaks and the second streaks is identical to the angle between the second streaks and the third streaks.

According to the volume hologram of the first aspect of the invention, the angles between the incidence surface and each of the first streaks, the second steaks, and the third streaks, are different from each other, and the angle between the first streaks and the second streaks is identical to the angle between the second streaks and tee third streaks. In this constitution, therefore, when the light is led to be incident into the volume hologram, the wavelengths of incident light are selected so that the spaces between the selected wavelengths (wavelength-bands) are constant in the wavelength distribution. Therefore, since the wavelengths selected from incident light never overlap each other, it is possible to widen the spectral bandwidth of the output light by leading the coherent light having a plurality of wavelengths to be incident into the volume hologram.

It is preferable that the volume hologram of the first aspect of the invention further include a first interference fringes group including the interference fringes having the steaks extending in predetermined directions; and a second interference fringes group including the interference fringes having the streaks extending in the directions intersecting the predetermined directions.

According to the volume hologram of the first aspect of the invention, since the volume hologram includes the first interference fringes group and the second interference fringes group, further various interference fringes having various angles between the steaks and the incidence surface are formed in the volume hologram. In this constitution, when the coherent light having specific wavelengths is led to be incident into the volume hologram, it is possible to narrow the wavelength-bandwidth which is selected from the incident light. Therefore, with regard to the output light emitted from the volume hologram, since the number of wavelength-bands including the wavelengths at which the intensity of the output light exhibits peak values (hereinafter simply referred to as peak wavelengths) increases, it is possible to further reduce speckle noise.

It is preferable that, in the volume hologram of the first aspect of the invention, the interference fringes be formed in a direction substantially perpendicular to a central axis of the coherent light that is incident into the incidence surface or in a direction substantially parallel to the central axis of the coherent light.

According to the volume hologram of the first aspect of the invention, when the interference fringes are formed in a direction substantially perpendicular to the central axis of the coherent light, it is possible to lead the coherent light having specific wavelengths to be diffracted (reflected).

Alternatively, when the interference fringes are formed in a direction substantially parallel to the central axis of the coherent light, it is possible to lead the coherent light having specific wavelengths to be diffracted.

A second aspect of the invention provides a volume hologram including: an incidence surface onto which coherent light having a plurality of wavelengths is incident; and a plurality of interference fringes having streaks so that the streaks extend in a direction substantially parallel to the incidence surface, so that distances between the streaks are different from each other, and so that each interference fringe corresponds to one wavelength of the coherent light.

According to the volume hologram of the second aspect of the invention, since the interference fringes having streaks extending in a direction substantially parallel to the incidence surface are formed (recorded), the volume hologram can function as a resonance mirror having wavelength selectivity so as to select a predetermined wavelength from the wavelengths of the incident coherent light by leading the coherent light to be incident into the incidence surface in a substantially vertical direction to the incidence surface. Therefore, the volume hologram can function as the external resonator so as to reduce the speckle noise of the light emitted from the volume hologram.

A third aspect of the invention provides a light source device including; a light source section having a plurality of emission sections and emitting coherent light having a plurality of wavelengths; and an external resonator causing the coherent light emitted from the light source section to resonate, and having the volume hologram described above, onto which the coherent light is incident, which has various interference fringes having the streaks whose distances are different from each other corresponding to each wavelength of the coherent light, and which selectively emits each wavelength of the coherent light caused by the interference fringes.

The various interference fringes having the streaks whose distances are different from each other are obtained by performing multiple exposures onto the volume hologram.

The volume hologram in which the various interference fringes having the streaks whose distances are different from each other are formed (recorded) can function as a resonance mirror. That is, the resonance mirror has wavelength selectivity so as to select a predetermined wavelength from the wavelengths of the light. By using the volume hologram functioning as a resonance mirror, it is possible to resonate the coherent light having specific wavelengths. Furthermore, since the coherent light having specific wavelengths can be emitted, it is possible to shorten the coherence length, and reduce speckle noise.

In conventional light source devices, volume holograms have been disposed to correspond to emission elements so that the wavelength selectivity of holograms corresponds to each wavelength of the light emitted from the emission elements. In conventional light source devices, alignment between the emission elements and the volume holograms is necessary.

In contrast, in the light source device of the third aspect of the invention, the distances between the streaks are the distances along a direction identical to the optical-path of the coherent light, and are determined based on the wavelengths of coherent light which are selected by the volume hologram. In the volume hologram having the interference fringes having streaks, a predetermined wavelength of light is selected from the coherent light based on the distances between the streaks of the interference fringes when the coherent light is incident into the volume hologram.

Therefore, it is unnecessary to dispose a plurality of volume holograms so as to correspond to the wavelengths of the light emitted from the emission light of the emission elements.

Thus, it is possible to resonate each wavelength of the coherent light without depending on the incident position on which coherent light is incident into the volume hologram, that is, without depending on alignment between the emission elements and the volume holograms.

Therefore, complicated alignment between each emission section and each volume hologram is unnecessary, thereby it is possible to manufacture the light source device with a simple assembly. In this constitution using an external resonator, it is possible to obtain a light source device in which speckle noise can be reduced.

It is preferable that, in the light source device of the third aspect of the invention, the volume hologram causes each wavelength of the coherent light incident into the volume hologram to be selectively reflected.

In is constitution, it is possible to resonate the coherent light having each specific wavelength which is incident into the volume hologram.

It is preferable that, in the light source device of the third aspect of the invention, the volume hologram be formed so that the thickness of the volume hologram is determined based on the spaces between the wavelengths (wavelength-bands) of the coherent light which is incident into the volume hologram.

The selective wavelength-bandwidth of the volume hologram depends on the thickness of the volume hologram.

By determining the selective wavelength-bandwidth of volume hologram corresponding to the space between the wavelengths of the coherent light, it is possible to prevent the generation of useless diffracted light in the other interference fringes of the volume hologram corresponding to wavelengths different from the selective wavelength.

In this constitution, it is possible to reduce degradation of the utilization efficiency of the light.

It is preferable that the light source device of the third aspect of the invention further include a wavelength conversion element disposed in an optical path between the light source section and the external resonator, and causing each wavelength of the coherent light which has been emitted from the light source section and which is incident into the wavelength conversion element to be converted.

In this constitution, it is possible to emit the coherent light whose wavelength has been converted by the wavelength conversion element.

It is preferable that the light source device of the third aspect of the invention further include a temperature adjustment section adjusting the temperature of the wavelength conversion element so that the wavelength conversion element has temperature gradients corresponding to the wavelengths of the coherent light which are incident into the wavelength conversion element.

In the wavelength conversion element, the wavelength of the coherent light can be converted into a predetermined wavelength depending on the temperature of the wavelength conversion element.

In this constitution, by leading the coherent light to be incident into the wavelength conversion element, it is possible to change the wavelengths of the coherent light depending on the temperate gradient of the wavelength conversion element.

A fourth aspect of the invention provides an illumination device including the light source device described above illumining an object with the light emitted therefrom.

According to the illumination device of the fourth aspect of the invention, by using the above-described light source device, it is possible to emit light with a high level of efficiency and reduce speckle noise. In this constitution, it is possible to obtain the illumination device which emits the light with a high level of efficiency while reducing speckle noise.

A fifth aspect of the invention provides a monitor including the illumination device described above; and a capturing section capturing the object which is illuminated with the light emitted from the illumination device.

According to the monitor of the fifth aspect of the invention, by using the above-described illumination device, it is possible to emit light with a high level of efficiency and reduce speckle noise. In this constitution, it is possible to obtain the monitor in which an image is monitored for brightness and quality.

A sixth aspect of the invention provides an image display device: the light source device as described above displaying an image using the light emitted therefrom.

According to the image display device of the sixth aspect of the invention, by using the above-described light source device, it is possible to emit light with a high level of efficiency and reduce speckle noise. In this constitution, it is possible to obtain the image display device in which an image is displayed with brightness and of high quality.

DESCRIPTION OF EXEMPLARY EMBODIMENTS

Hereinafter, embodiments of the invention will be described with reference to the accompanying drawings.

First Embodiment

A volume hologram of a first embodiment of the invention will be explained with reference to FIGS. 1 and 2.

Figure 1:
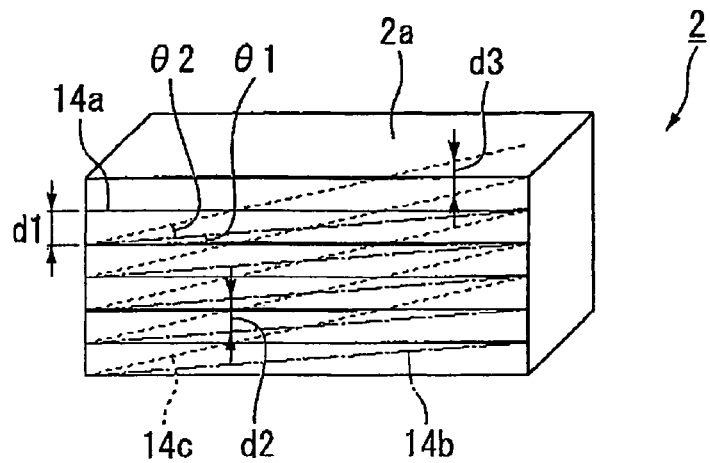
FIG. 1 is a schematic view showing a constitution of a volume hologram of a first embodiment of the invention.

As shown in FIG. 1, in the volume hologram 2 of the first embodiment, interference fringes having streaks are formed (recorded) so that the angles between the streaks and the incidence surface 2a are different from each other, and so that the each interference fringe corresponds to one wavelength of the light which is incident into the incidence surface 2a.

Specifically, in the volume hologram 2, there are interference fringes 14a (first interference fringes), interference fringes 14b (second interference fringes), and interference fringes 14c (third interference fringes). The interference fringes 14a have streaks (first streaks) separated by the distance d1 therebetween. The interference fringes 14b have streaks (second streaks) separated by the distance d2 therebetween. The interference fringes 14c have streaks (third streaks) separated by the distance d3 therebetween. Also, distances d1 to d3 are identical to each other.

Furthermore, the angle between the first streak of the interference fringes 14a and the second streak of the interference fringes 14b is defined as an angle θ1. The angle between the second streak of the interference fringes 14b and the third streak of the interference fringes 14c is defined as an angle θ2. Here, the angle θ1 and the angle θ2 are identical angles.

Figure 2:
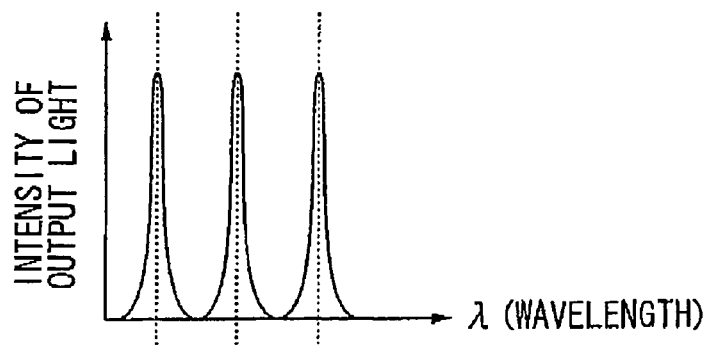
FIG. 2 is a schematic diagram showing a light spectrum of the light emitted from the volume hologram shown in FIG. 1.

When light is led to be incident into the incidence surface 2a of the volume hologram 2, a plurality of wavelengths of light is selectively emitted as shown in FIG. 2. In FIG. 2, the axis of abscissa refers to wavelengths and the axis of ordinate refers to intensity of output light.

Here, since the angle θ1 is identical to the angle θ2, the peak wavelengths included in the wavelength-bandwidths which have been selected by the volume hologram 2 are separated by regular spacing.

Furthermore, when the spectral bandwidth is broad and the number of beams is high, it is possible to efficiently reduce speckle noise.

Here, the output spectral bandwidth means the entire spectral bandwidth including a plurality of narrow bandwidths of the light beam including center wavelengths which are different from each other.

As described above, in the volume hologram 2 of the first embodiment, the optical distances of light passing through the volume hologram 2 vary depending on the interference fringes 14a to 14c. Therefore, even if the distances d1 to d3 of streaks of interference fringes 14a to 14c, the wavelengths of light outputting from the volume hologram 2 are different from each other depending on the angle between the first streaks and incidence surface 2a, on the angle between the second streaks and incidence surface 2a, and on the angle between the third streaks and incidence surface 2a.

Therefore, the output spectral bandwidth of the wavelength-bandwidth of the light emitted from the volume hologram 2 is broadened. It is possible to reduce the speckle noise of the light emitted from the volume hologram 2.

Furthermore, in this embodiment, the angle θ1 and the angle θ2 are identical, that is, the first streak of the interference fringes 14a, the second streak of the interference fringes 14b, and the third streak of the interference fringes 14c are set at identical angles to each other. Therefore, adjacent wavelengths of the wavelengths selected from the light never overlap each other. It is possible to broaden the output spectral bandwidth.

In the above-described embodiment the angle θ1 is identical to the angle θ2. However, this embodiment is not limited to this constitution. Also, this embodiment is not limited to cases where the distances d1 to d3 are identical each other.

Second Embodiment

A volume hologram of a second embodiment of the invention will be explained with reference to FIGS. 3 and 4.

A volume hologram 3 of the second embodiment is different from the first embodiment in the point that the volume hologram 3 includes a plurality of interference fringes groups.

Figure 3:
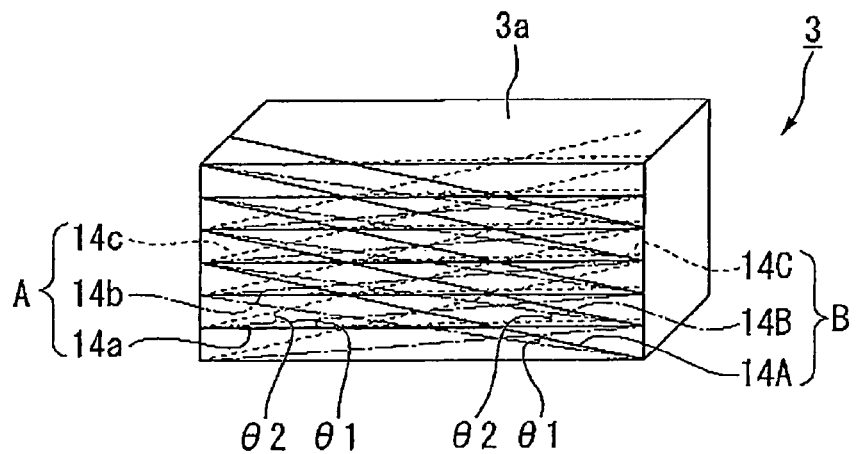
FIG. 3 is a schematic view showing a constitution of a volume hologram of a second embodiment of the invention.

As shown in FIG. 3, the volume hologram 3 includes an interference fringes group A (first interference fringes group) and an interference fringes group B (second interference fringes group).

The interference fringes group A includes the interference fringes 14a having the first streaks, the interference fringes 14b having the second streaks, and the interference fringes 14c having the third streaks. Also, the second streaks of the interference fringes 14b are set at the angle θ1 to the first streaks of the interference fringes 14a, and the third streaks of the interference fringes 14c are set at the angle θ2 to the second streaks of the interference fringes 14b. In the interference fringes group A, each of the first streaks, the second streaks, and the third steaks extends in a predetermined direction.

The interference fringes group B includes the interference fringes 14a having the first streaks, the interference fringes 14b having the second streaks, and the interference fringes 14c having the third streaks. Also, the second streaks of the interference fringes 14b are set at the angle θ1 to the first streaks of the interference fringes 14a, and the third streaks of the interference fringes 14c are set at the angle θ2 to the second streaks of the interference fringes 14b. In the interference fringes group B, each of the first streaks, the second streaks, and the third streaks extends in a direction intersecting the predetermined direction of the interference fringes group A.

Also, in the interference fringes groups A and B, the angle θ1 is identical to the angle θ2.

Similarly to the first embodiment, in each interference fringes group A and interference fringes group B, each distance between the first streaks, distance between the second streaks, and distance between the third streaks is identical to each other.

Figure 4:
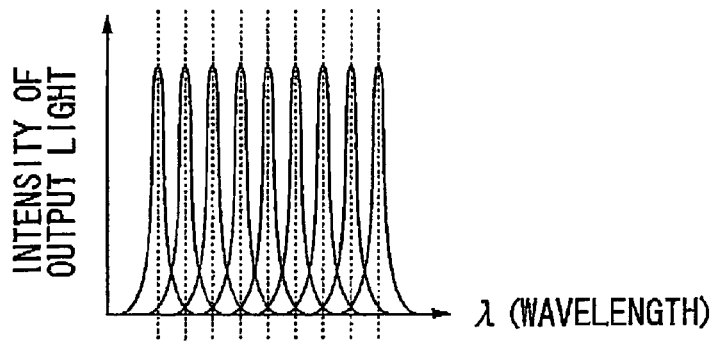
FIG. 4 is a schematic diagram showing a light spectrum of the light emitted from the volume hologram shown in FIG. 3.

When light is led to be incident into the incidence surface 3a of the volume hologram 3, a plurality of wavelengths of light is selectively emitted as shown in FIG. 4. In FIG. 4, the axis of abscissa means wavelengths and the axis of ordinate means intensity of output light.

Here, since the angle θ1 is identical to the angle θ2, the peak wavelengths included in the wavelength-bandwidths which have been selected by the volume hologram 3 are separated by regular spacing.

Furthermore, when the spectral bandwidth is broad and the number of beams is high, it is possible to efficiently reduce speckle noise.

As described above, the volume hologram 3 of the second embodiment includes the interference fringes group A and the interference fringes group B, and a lot of the interference fringes 14a to 14c having the streaks are formed in the volume hologram 3 compared with the volume hologram 2 of the first embodiment. Therefore, it is possible to emit the light having the peak wavelengths of the wavelength-bandwidth whose spacing is narrower than that of the first embodiment.

That is, the number of peak wavelengths included in the wavelength-bandwidths of the light emitted from the volume hologram 3 increases depending on the increase in the number of streaks of the interference fringes 14a to 14c. It is possible to further obtain efficiency of reduction of speckle noise.

In the above-described embodiment, the angles θ1 and θ2 between the streaks of the interference fringes group A are identical to that of the interference fringes group B. However, this embodiment is not limited to this constitution. The angles θ1 and θ2 between the streaks of the interference fringes group A may be different from that of the interference fringes group B.

That is, in the interference fringes group B, the second streaks are set at an angle θ3 to the first streaks, the third streaks are set at an angle θ4 to the second streaks, and the interference fringes 14a to 14c are formed in the interference fringes group B so that the angles θ1 and θ2 of the interference fringes group A are different from the angles θ3 and θ4 of the interference fringes group B.

Also, in this embodiment, the angle θ1 is identical to the angle θ2. However, this embodiment is not limited to this constitution.

Third Embodiment

A volume hologram of a third embodiment of the invention will be explained with reference to FIG. 5.

Figure 5:
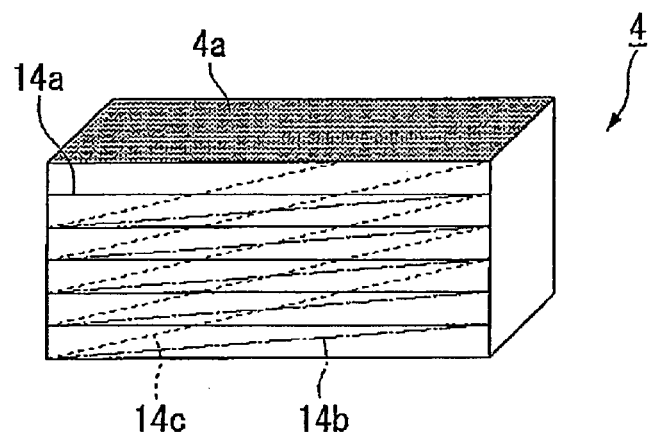
FIG. 5 is a schematic view showing a constitution of a volume hologram of a third embodiment of the invention.

As shown in FIG. 5, the interference fringes are not formed on the incidence surface 4a of the volume hologram 4 of the third embodiment. The other constitutions of the volume hologram 4 are the same as the constitutions of the volume hologram 2 of the first embodiment.

In the method for manufacturing the volume hologram 4, for example, the volume hologram 4 is subjected to an interference exposure by using two exposure beams so as to dispose a diffractive optical element on the incidence surface 4a.

In this manner, the interference fringes are not formed on the surface of volume hologram 4 on which the diffractive optical element is disposed, and the interference fringes are formed only inside of the volume hologram 4.

Therefore, in this constitution, for example, even if the incidence surface 4a of the volume hologram 4 is damaged a little, the interference fringes formed inside of the volume hologram 4 are unlikely to be damaged.

In this constitution, it is possible to manufacture the volume holograms 4 with high yield.

Fourth Embodiment

A volume hologram of a fourth embodiment of the invention will be explained with reference to FIG. 6.

Figure 6:
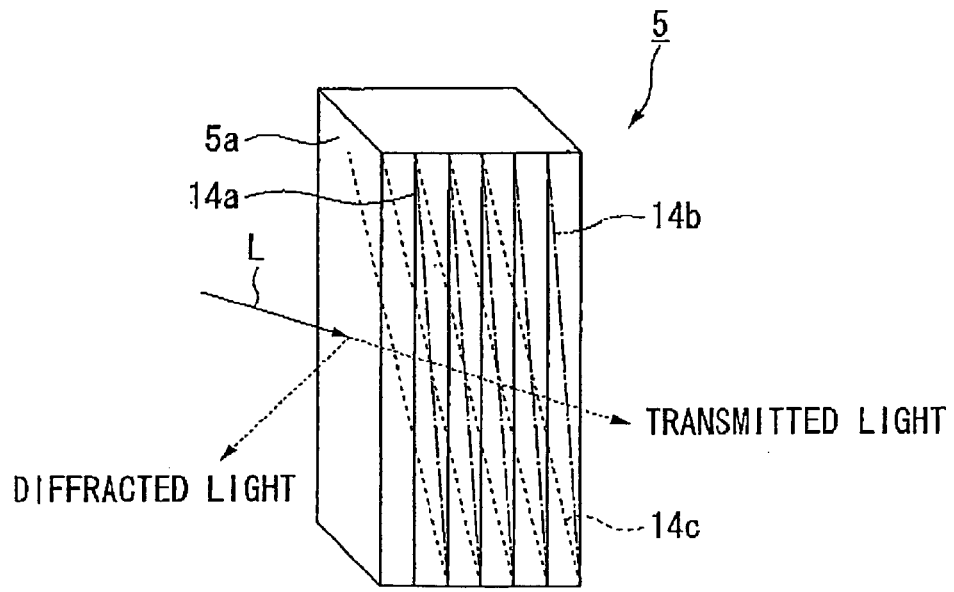
FIG. 6 is a schematic view showing a constitution of a volume hologram of a fourth embodiment of the invention.

As shown in FIG. 6, in the fourth embodiment, the interference fringes 14a, 14b, and 14c are formed in the volume hologram 5 similarly to the first embodiment, and in a direction substantially perpendicular to the center axis of the light L which is incident into the volume hologram 5.

In this constitution, by leading the light into the incidence surface 5a, the specific wavelength of light which satisfies the Bragg condition are diffracted (reflected), the other wavelengths of light are transmitted trough the volume hologram 5.

Figure 7:
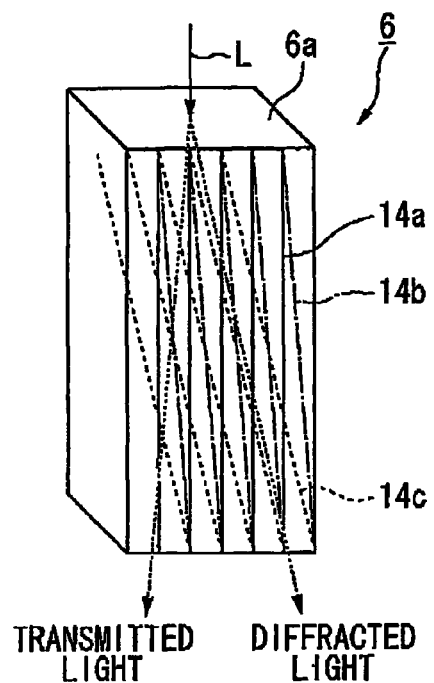
FIG. 7 is a schematic view showing a constitution of a volume hologram of a fifth embodiment of the invention.

Alternatively, as shown in FIG. 7, the interference fringes 14a, 14b, and 14c are formed in the volume hologram 6 similarly to the first embodiment, and in a direction substantially parallel to the center axis of the light L which is incident into the volume hologram 6. That is, in the thickness direction of the volume hologram 6.

In this constitution, by leading the light into the incidence surface 6a, the specific wavelength of light which satisfies the Bragg condition are diffracted, the other wavelengths of light are transmitted through the volume hologram 6.

As described above, in the fourth embodiment, the volume hologram 5 can be used as a reflection hologram, and the volume hologram 6 can be used as a transmission hologram.

Fifth Embodiment

A volume hologram of a fifth embodiment of the invention will be explained with reference to FIG. 8.

A volume hologram 7 of the fifth embodiment is the volume hologram leading the laser light which is incident thereinto to be resonated. As shown in FIG. 8, the volume hologram 7 includes a plurality of interference fringes having streaks so that the streaks extend in a direction substantially parallel to the incidence surface 7a and so that the distances between the streaks are different from each other.

Specifically, in the volume hologram 7, interference fringes 15a (first interference fringe), interference fringes 15b (second interference fringe), and interference fringes 15c (third interference fringe) are formed. The interference fringes 15a have streaks (first streaks) separated by the distance d1. The interference fringes 15b have streaks (second streaks) separated by the distance d2. The interference fringes 15c have streaks (third streaks) separated by the distance d3.

Additionally, these distances d1 to d3 are different from each other.

When the light is led to be incident into the incidence surface 7a of the volume hologram 7, similarly to the first embodiment, a plurality of wavelengths of light is selectively emitted.

Furthermore, when the light is led to be vertically incident into the incidence surface 7a of the volume hologram 7, the specific wavelength of light which satisfies the Bragg condition the incidence surface 7a is diffracted by the volume hologram 7 in the optical path identical to the optical path of the light which has been incident into the volume hologram 7.

As described above, in the volume hologram 1 of the fifth embodiment, similarly to the above-described hologram elements 2 to 6, since various wavelengths of light are selectively reflected, it is possible to reduce speckle noise.

Furthermore, when the volume hologram 7 is applied to a light source device, it is possible to use the volume hologram 7 as an external resonance mirror.

Sixth Embodiment

Figure 9:
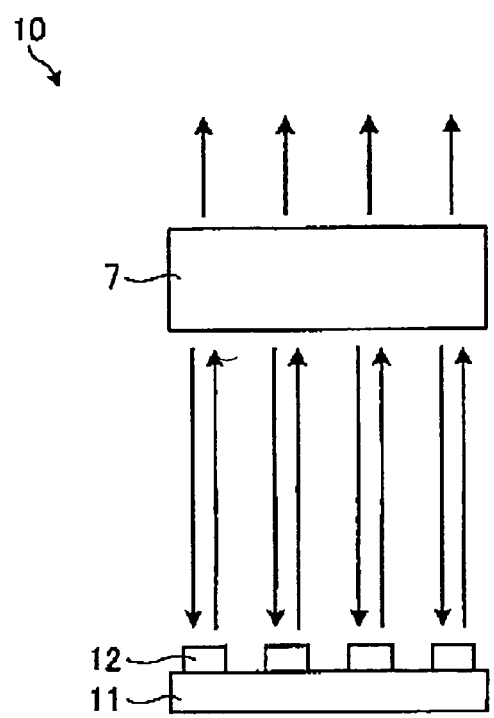
FIG. 9 is a schematic diagram illustrating constitution in which each wavelength of laser light is selectively reflected.

FIG. 9 schematically shows a constitution of a light source device 10 of a sixth embodiment of the invention.

The light source device 10 includes a semiconductor laser 11. The semiconductor laser 11 is the light source section supplying the laser light that is coherent light, and is a surface emission type semiconductor laser. The semiconductor laser 11 includes four emission sections 12 that are formed in parallel.

In the sixth embodiment, the volume hologram 7 of the fifth embodiment described above is used and disposed in the optical path of the laser light emitted from the semiconductor laser 11. The volume hologram 7 is the external resonator leading the laser light emitted from the semiconductor laser 11 to be resonated. In the volume hologram 7, the interference fringes 15 are formed by leading two light beams into the volume hologram 7.

The interference fringes 15 are formed so as to include the periodic structure in which a portion having a high refractive index and a portion having a low refractive index are periodically arrayed.

The volume hologram 7 leads the only wavelength of light, which satisfies the Bragg condition with the interference fringes 15, to be selectively reflected by the diffraction thereof.

The laser light reflected by the volume hologram 7 is led toward the semiconductor laser 11. The laser light which has been reflected by the volume hologram 7 and led toward the semiconductor laser 11 is reflected by the mirror layer (not shown) of the semiconductor laser 11.

The laser light which has been reflected by the mirror layer and the volume hologram 7 is resonated and amplified with the laser light which is newly emitted from the emission sections 12.

The volume hologram 7 leads the part of the light which has been amplified between the semiconductor laser 11 and the volume hologram 7 to be passed therethrough and to emit the passed light out toward the light source device 10. In this constitution, it is possible to output the laser light with a high power and narrow bandwidth.

As the material of the volume hologram 7, a volume hologram is formed in a crystal form by crystals such as lithium niobate or the like, or a photopolymer volume hologram formed of a photopolymer may be used.

The semiconductor laser 11 emits laser light having wavelength distributions including peak wavelengths $\lambda 1$, $\lambda 2$, $\lambda 3$, and $\lambda 4$. The peak wavelengths $\lambda 1$, $\lambda 2$, $\lambda 3$, and $\lambda 4$ are emitted from the emission sections 12, respectively. The values of the peak wavelengths $\lambda 1$, $\lambda 2$, $\lambda 3$, and $\lambda 4$ are different from each other. Here, the relationship $\lambda 1 < \lambda 2 < \lambda 3 < \lambda 4$ is satisfied in this embodiment.

The values of wavelengths $\lambda 1$, $\lambda 2$, $\lambda 3$, and $\lambda 4$ are distributed in a scope in which the values from minimum values to maximum values are, for example, approximately 10 nm ($\lambda 4 - \lambda 1 \leq 10$ nm).

Spaces between the wavelengths $\lambda 2 - \lambda 1$, $\lambda 3 - \lambda 2$, and $\lambda 4 - \lambda 3$, which are differences between values of peak wavelengths, are optionally determined. Each space between the wavelengths may be approximately a few nm. The space between the wavelengths can be determined by deliberate optical design or by errors occurring in manufacturing. The spaces between the wavelengths $\lambda 2 - \lambda 1$, $\lambda 3 - \lambda 2$, and $\lambda 4 = \lambda 3$ may be irregularly determined so as to efficiently reduce speckle noise.

The volume hologram 7 leads the wavelengths of laser light emitted from the semiconductor laser 11 to be selectively reflected.

In the sixth embodiment, since the volume hologram 7 of the fifth embodiment is applied to the light source device 10, the volume hologram 7 leads the wavelengths of laser light emitted from the semiconductor laser 11 to be selectively reflected.

Figure 8:
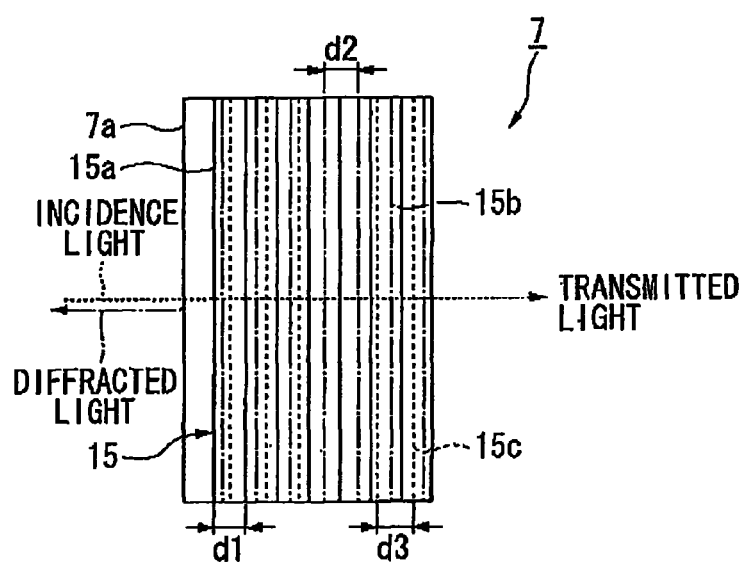
FIG. 8 is a schematic view showing a constitution of a volume hologram of a sixth embodiment of the invention.

FIG. 8 schematically shows the constitution of the volume hologram leading the wavelengths of laser light emitted from the semiconductor laser 11 to be selectively reflected. In FIG. 8, the interference fringes 15 are simply shown.

In the interference fringes 15, the interference fringes 15a having streaks indicated by solid line in FIG. 8 are periodically formed (recorded) so that the streaks of interference fringes 15a are separated by the distance d1.

The distance d1 satisfies the Bragg condition with regard to the wavelength $\lambda 1$. Therefore, the interference fringes 15a whose streaks are separated by the distance d1 lead the light of wavelength $\lambda 1$ to be selectively reflected.

Furthermore, in the interference fringes 15, the interference fringes 15b having streaks indicated by dashed and dotted lines in FIG. 8 are periodically formed (recorded) so that the streaks of interference fringes 15b are separated by the distance d2 different from the distance d1.

The distance d2 satisfies the Bragg condition with regard to the wavelength $\lambda 2$. Therefore, the interference fringes 15b whose streaks are separated by distance d2 lead the light of wavelength $\lambda 2$ to be selectively reflected.

Furthermore, in the interference fringes 15, the interference fringes 15c having streaks indicated by broken lines in FIG. 8 are periodically formed (recorded) so that the streaks of the interference fringes 15c are separated by the distance d3 which is different from distance d2.

The distance d3 satisfies the Bragg condition with regard to the wavelength $\lambda 3$. Therefore, the interference fringes 15c whose streaks are separated by the distance d3 lead the light of wavelength $\lambda 3$ to be selectively reflected.

Furthermore, in the interference fringes 15, the other interference fringes having streaks are formed so that the streaks are separated by the distance satisfying the Bragg condition with regard to the wavelength $\lambda 4$.

The interference fringes 15 are constituted so as to cause the interference fringes corresponding to the wavelengths $\lambda 1$ to $\lambda 4$ to overlap.

As described above, in the volume hologram 7, by using the interference fringes 15, whose streaks are separated by distances different from each other so that the distances correspond to wavelengths $\lambda 1$ to $\lambda 4$ of the laser light emitted from the semiconductor laser 11, the laser light of wavelengths $\lambda 1$ to $\lambda 4$ is led to be selectively reflected.

Here, the interference fringes 15a whose streaks are separated by the distance d1 friction to lead only the light of wavelength $\lambda 1$ to be reflected. The interference fringes 15a do not lead the light of wavelength $\lambda 2$ to be reflected.

As described above, each of the distances between the streaks of the interference fringes 15 functions to selectively reflect light corresponding to one wavelength of the laser light.

The volume hologram 7 in which the interference fringes 15 having streaks whose distances are different from each other can function as the resonance mirror having wavelength selectivity so as to select predetermined wavelengths from the light.

By resonating the laser light having the wavelengths $\lambda 1$ to $\lambda 4$, the light source device 10 can emit the laser light having the wavelengths $\lambda 1$ to $\lambda 4$.

The interference fringes 15 having streaks whose distances are different from each other are obtained by performing multiple exposures onto the volume hologram 7.

It is desirable that the thickness of volume hologram 7 be formed so as to satisfy the formula as follows:

$$T \geq \frac{\lambda^2}{\Delta\lambda(n \mp \sqrt{n^2 - \sin^2\theta})}$$

In the above formula, the "$\lambda$" is minimum value of wavelength of the laser light which is incident in to the volume hologram 7, the "$\Delta\lambda$" is the spaces between wavelengths of the laser light, the "n" is the refractive index of member constituting the volume hologram 7, and the "$\theta$" is the angle between incidence lights when the interference fringes 15 are formed (recorded) into the volume hologram 7.

As the $\Delta\lambda$, the minimum value among the spaces between wavelengths $\lambda 2 - \lambda 1$, $\lambda 3 - \lambda 2$, and $\lambda 4 - \lambda 3$ can be adopted.

The volume hologram 7 is formed so as to have the thickness T which is determined based on the spaces between wavelengths $\Delta\lambda$ of the laser light which is incident into the volume hologram 7.

Figure 10:
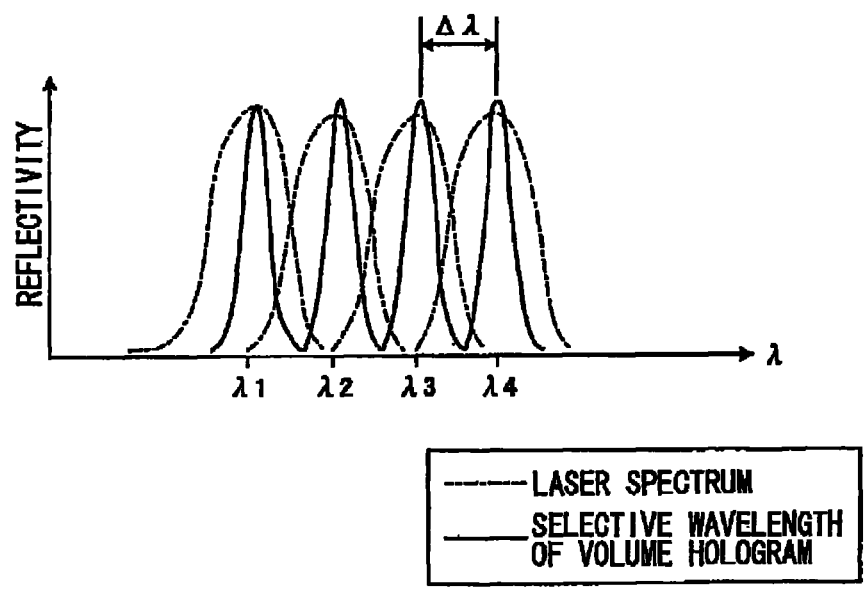
FIG. 10 is a schematic diagram illustrating wavelength selectivity of a volume hologram.

FIG. 10 is a schematic diagram for explanation of the wavelength selectivity of the volume hologram 7. By determining the thickness T of the volume hologram 7 as described above, with regard to the peak wavelengths $\lambda 1$ to $\lambda 4$, the volume hologram 7 has reflectance property (reflectivity) whose wavelength-bandwidth is narrower than the wavelength-bandwidth of the spectrum of the semiconductor laser 11.

By determining the selective wavelength of the volume hologram 7 as described above, predetermined wavelengths are selected from the light based on the distances between the streaks of the interference fringes 15. Therefore, it is possible to prevent the generation of useless diffracted light in the other interference fringes of volume hologram 7 corresponding to wavelengths different from the selective wavelength.

In this constitution, it is possible to reduce degradation of the utilization efficiency of light. Since the light source device 10 can emit laser light having specific wavelengths, it is possible to shorten the coherence length and reduce speckle noise.

In the volume hologram 7 having the interference fringes having streaks, predetermined wavelengths are selected from the light based on the distances between the streaks of the interference fringes 15 when the light is incident into the volume hologram 7.

Therefore, it is unnecessary to dispose a plurality of volume holograms so as to correspond to the wavelengths of emission light of emission elements.

Thus, it is possible to resonate the laser light having each wavelength without depending on the incident position on which laser light is incident into the volume hologram 7, that is, without depending on alignment between the emission elements and the volume holograms.

Therefore, complicated alignment between each emission section 12 and each volume hologram 7 is unnecessary in the case of using a plurality of volume holograms 7, thereby it is possible to manufacture the light source device 10 having a simple assembly.

In this constitution, which uses an external resonator, it is possible to obtain a light source device in which speckle noise can be reduced.

It is sufficient that the semiconductor laser 11 emits the laser light having specific wavelengths from the emission sections 12. This invention is not limited to the constitution including four emission sections 12.

As the light source section, an edge emission type semiconductor laser may be used instead of the surface emission type semiconductor laser 11. Furthermore, the volume hologram 7 of the fifth embodiment is used as the external resonator.

However, the constitution with the external resonator including the each volume hologram 2 to 6 of the first, second, third, and fourth embodiments may be used. In this constitution, it is sufficient that the external resonator include the reflection mirror reflecting the light which is incident into the external resonator in the optical path identical to the optical path of the incident light.

Seventh Embodiment

Figure 11:
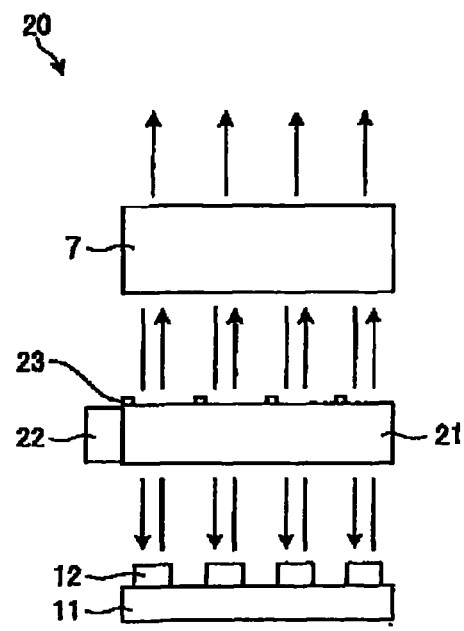
FIG. 11 is a schematic view showing a constitution of a light source device of a seventh embodiment of the invention.

FIG. 11 schematically shows a constitution of a light source device 20 of a seventh embodiment of the invention.

A light source device 20 of the seventh embodiment includes a Second-Harmonic Generation element 21 (SHG element).

In FIG. 11, identical symbols are used for the elements which are identical to those of the above-described sixth embodiment are assigned identical symbols, and the corresponding explanations are omitted.

The SHG element 21 is a wavelength conversion element that converts the wavelength of the laser light emitted from the semiconductor laser 11 into a predetermined wavelength.

The SHG element 21 is disposed on the optical path between the semiconductor laser 11 and the volume hologram 7.

The SHG element 21 reduces the wavelength of the laser light emitted from the semiconductor laser 11 by half. The converted laser light is emitted then from the SHG element 21.

As a material of the SHG element 21, for example, a nonlinear optical crystal can be used.

As the nonlinear optical crystal, for example, a polarization inversion crystal (Periodically Poled Lithium Niobate:PPLN) of a lithium niobate (LiN:LiNbO$_3$) can be used.

A heater 22 is a temperature adjustment section that adjusts the temperature of the SHG element 21 by producing heat.

Thermistors 23 are provided on the SHG element 21 and at the positions corresponding to the four laser lights. Each thermistor 23 measures temperature of the each position of the SHG element 21.

Each thermistor 23 is disposed on the portion of SHG element 21 onto which the laser light is not incident.

The heater 22 is disposed on the end portion of the SHE element 21.

The heater 22 controls the temperature of the SHG element 21 so as to include different temperature gradients. Specifically, the heater 22 controls the temperature of the SHG element 21 so that the portion which is close to the end portion on which heater 22 is disposed has a higher temperature tan the temperature of the portion which is farther from the end portion.

Figure 12:
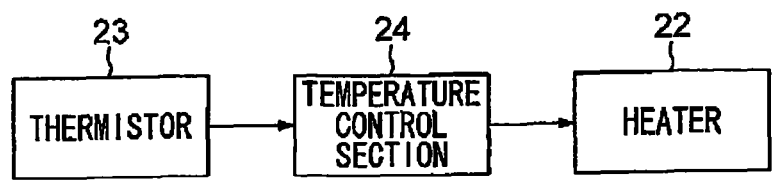
FIG. 12 is a block diagram showing a constitution for adjusting temperature of the SHG element.

FIG. 12 shows a block diagram of a constitution for adjusting the temperature of the SHG element 21.

The thermistor 23 outputs a changing of resistance value which changes the temperature value of the SHG element 21 to a temperature control section 24.

The temperature control section 24 determines the amount of electric energy which has been supplied to the heater 22 based on the difference between the temperature measured by the thermistor 23 and a predetermined temperature. The temperature control section 24 supplies electric power to the heater 22 so as to correspond to the electric energy which is determined based on the temperature difference.

The temperature control section 24 controls the heater 22 based on the feedback of measurement result of the thermistor 23.

Furthermore, the temperature control section 24 determines if the temperatures of SHG element 21 which are measured by each thermistor 23 indicate the temperature gradient which corresponds to each wavelength of the laser light which is incident into the SHG element 21.

The heater 22 controls the temperature of SHG element 21 so that the SHG element 21 has a temperature gradient corresponding to the wavelengths of the laser light which are incident into the SHG element 21.

The wavelength of laser light which can be converted by the SHG element 21 depends on the temperature of the SHG element 21.

By controlling the temperature of the SHG element 21 so as to include a temperature gradient corresponding to each wavelength, the SHG element 21 can convert each wavelength of laser light emitted from the semiconductor laser 11 into a predetermined wavelength.

In this constitution, it is possible to emit laser light whose wavelength is converted by the SHG element 21.

The volume hologram 7 leads the laser light whose wavelength has not been converted by the SHG element 21 and which has passed through the SHG element 21 to be selectively reflected.

The laser light whose wavelength has been converted by the SHG element 21 passes through the volume hologram 7 and is emitted from the light source device 20.

By converting the wavelengths of laser light emitted from the emission sections 12 of the semiconductor laser 11, the light source device 20 emits the wavelengths of laser light.

Therefore, it is also possible to reduce the speckle noise in the seventh embodiment.

The light source device 20 is not limited to the constitution in which the temperature of SHG element 21 is controlled by the heater disposed at the end portion of the SHG element 21.

In order to control the temperature of SHG element 21 so as to include a temperature gradient corresponding to each wavelength of the laser light, the heater, for example, may be disposed at each incidence portion at which each laser light is incident into the SHG element 21.

As an example of the temperature adjustment section, a Peltier element may be used.

When using the Peltier element, the temperature of SHG element 21 may be controlled not only by applying heat, but also by absorbing heat (cooling).

Eighth Embodiment

Figure 13:
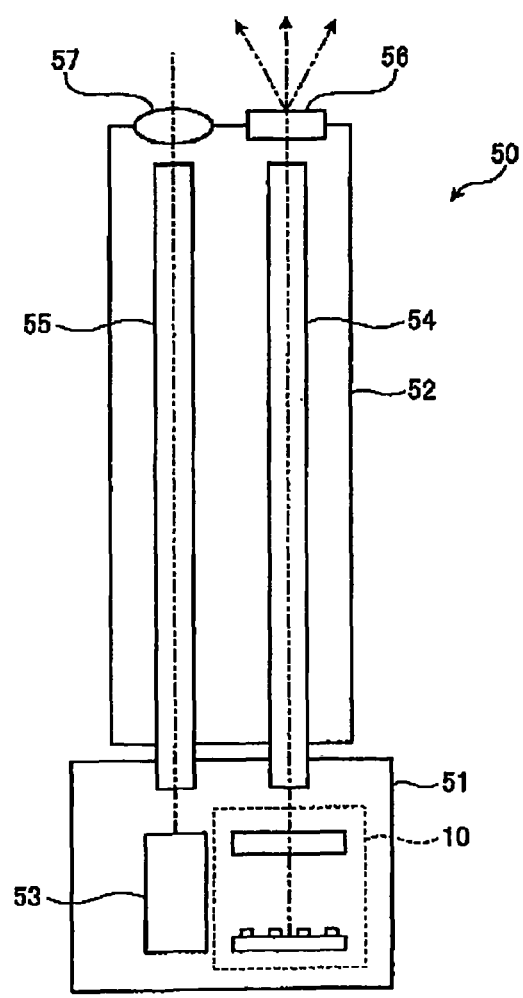
FIG. 13 is a schematic view showing a constitution of a monitor of an eighth embodiment of the invention.

FIG. 13 schematically shows a constitution of a monitor 50 of an eighth embodiment of the invention.

The monitor 50 includes a main body 51 and an optical transmission section 52.

The main body 51 includes the above-described light source device 10 of the sixth embodiment shown in FIG. 9.

In FIG. 13, identical symbols are used for the elements which are identical to those of the above-described sixth embodiment are assigned identical symbols, and the corresponding explanations are omitted.

The optical transmission section 52 includes two light guides: a first light guide 54, and a second light guide 55.

A diffusing plate 56 and an image-formation lens 57 are provided on the end portion of the optical transmission section 52 which is close to a target object (not shown).

The first light guide 54 transmits the light emitted from the light source device 10 to the object.

The diffusing plate 56 is provided on a light emission portion of the first light guide 54.

Therefore, the light which transmitted the first light guide 54 and which passed though the diffusing plate 56 is diffused toward the object.

Each section disposed on the optical path between the light source device 10 and the diffusing plate 56 constitutes an illumination device illuminating the object.

The second light guide 55 transmits the light from the object to a camera 53.

An image-formation lens 57 is provided on the light incident portion of the second light guide 55.

The image-formation lens 57 condenses the light from the object into the incident surface (light incident portion) of the second light guide 55.

The light from the object is incident into the second light guide 55 by the image-formation lens 57. The light which has been incident into the second light guide 55 and which is transmitted by the second light guide 55 is incident into the camera 53.

The first light guide 54 and the second light guide 55 may be constituted from a plurality of optical fibers that are sheaved. It is possible to transmit the laser light great distance by using the light guides 54 and 55 constituted by the optical fibers.

The camera 53 is provided in the main body 51.

The camera 53 is a capturing section capturing the target object which is illuminated by each section disposed on the optical path between the light source device 10 and the diffusing plate 56.

By leading the light which is incident into the second light guide 55 to be incident to the camera 53, the object can be captured by the camera 53.

By using the light source device 10 of the above-described sixth embodiment, it is possible to supply the light with a high level of efficiency while reducing speckle noise.

Therefore, it is possible to obtain the effect that a bright, high quality image is observed.

In the monitor 50 of the eighth embodiment, the light source device 20 of the above-described seventh embodiment may be applied instead of the light source device of the above-described sixth embodiment.

Ninth Embodiment

Figure 14:
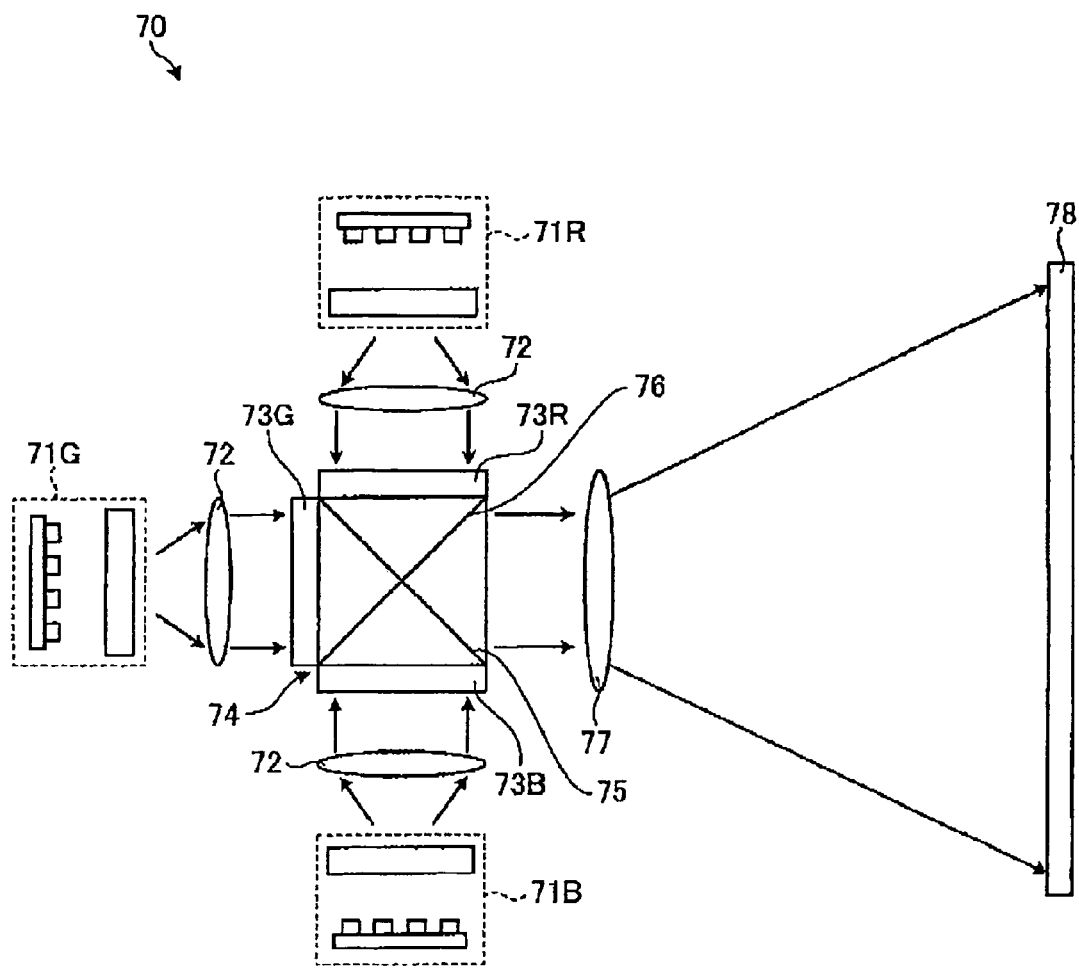
FIG. 14 is a schematic view showing a constitution of a projector of a ninth embodiment of the invention.

FIG. 14 schematically shows a constitution of a projector 70 of a ninth embodiment of the invention.

The projector 70 is a front projection-type projector (image display device) in which light is supplied onto a screen 78, and a viewer observes the reflected light on the screen 78.

The projector 70 includes an R light source device 71R that emits red (R) colored light, a G light source device 71G that emits green (G) colored light, and a B light source device 71B that emits blue (B) colored light.

Each light source device 71R, 71G, and 71B includes the constitution same as the light source device 10 of the above-described sixth embodiment shown in FIG. 9.

In FIG. 14, identical symbols are used for the elements which are identical to those of the above-described sixth embodiment are assigned identical symbols, and the reduplicate explanations are omitted.

The projector 70 displays an image using the light emitted from each light source device 71R, 71G, and 71B.

The R light source device 71R is a light source device that supplies Red colored light.

A field lens 72 leads the laser light emitted from the R light source device 71R to be converted into parallel rays and to be incident into an R spatial light modulation device 73R.

The R light source device 71R and the field lens 72 constitute the illumination device that illuminates the R spatial light modulation device 73R with the red colored light.

The R spatial light modulation device 73R is the spatial light modulation device that modulates the red colored light emitted from the illumination device corresponding to an image signal, and a transmissive liquid crystal display device.

The R light which has been modulated in the R spatial light modulation device 73R is incident into a cross-dichroic prism 74 that is a color synthesizing optical system.

The G light source device 71G is a light source device that supplies Green colored light.

The laser light which has been converted into the parallel rays by the field lens 72 is incident on a G spatial light modulation device 73G.

The G light source device 71G and the field lens 72 constitute the illumination device that illuminates the G spatial light modulation device 73G with the green colored light.

The G spatial light modulation device 73G is the spatial light modulation device that modulates the green colored light emitted from the illumination device corresponding to an image signal, and a transmissive liquid crystal display device.

The G light which has been modulated in the G spatial light modulation device 73G is incident into the surface of cross-dichroic prism 74 which is different surface from the surface onto which the R light is incident.

The B light source device 71G is a light source device that supplies Blue colored light.

The laser light which has been parallel by the field lens 72 is incident on a B spatial light modulation device 73B.

The B light source device 71B and the field lens 72 constitute the illumination device that illuminates the B spatial light modulation device 73B with the blue colored light.

The B spatial light modulation device 73B is the spatial light modulation device that modulates the blue colored light emitted from the illumination device corresponding to an image signal, and a transmissive liquid crystal display device.

The B light which has been modulated in the B spatial light modulation device 73B is incident into the surface of cross-dichroic prism 74 which is different surface onto which the R light and the G light are incident.

As the transmissive liquid crystal display device, for example, a liquid crystal panel in which Thin Film Transistor (TFT) including a High Temperature Polysilicon (HTPS) can be used.

The cross-dichroic prism 74 includes two dichroic films 75 and 76 which are disposed so as to be substantially orthogonal to each other.

The first dichroic film 75 leads the R light to be reflected and leads the G light and B light to be passed therethrough.

The second dichroic film 76 leads the B light to be reflected and leads the R light and G light to be passed therethrough.

The cross-dichroic prism 74 synthesizes the R light, the G light, and the B light, which are incident into the cross-dichroic prism 74 in the different direction from each other, and leads the synthesized lights to emit toward a projection lens 77.

The projection lens 77 leads the light R, G, and B, which has been synthesized in the cross-dichroic prism 74, to be projected onto the screen 78.

In the projector 70, by using each light source device 71R, 71G, and 71B including the same constitution as the above-described light source device 10, it is possible to supply the light with a high level of efficiency while reducing speckle noise.

Therefore, it is possible to obtain a bright high-quality image.

As a constitution of each light source device 71R, 71G, and 71B, not only the constitution of the light source device 10 of the above-described sixth embodiment, but also the constitution of the light source device 20 of the above-described seventh embodiment described above may be adopted.

Figure 15:
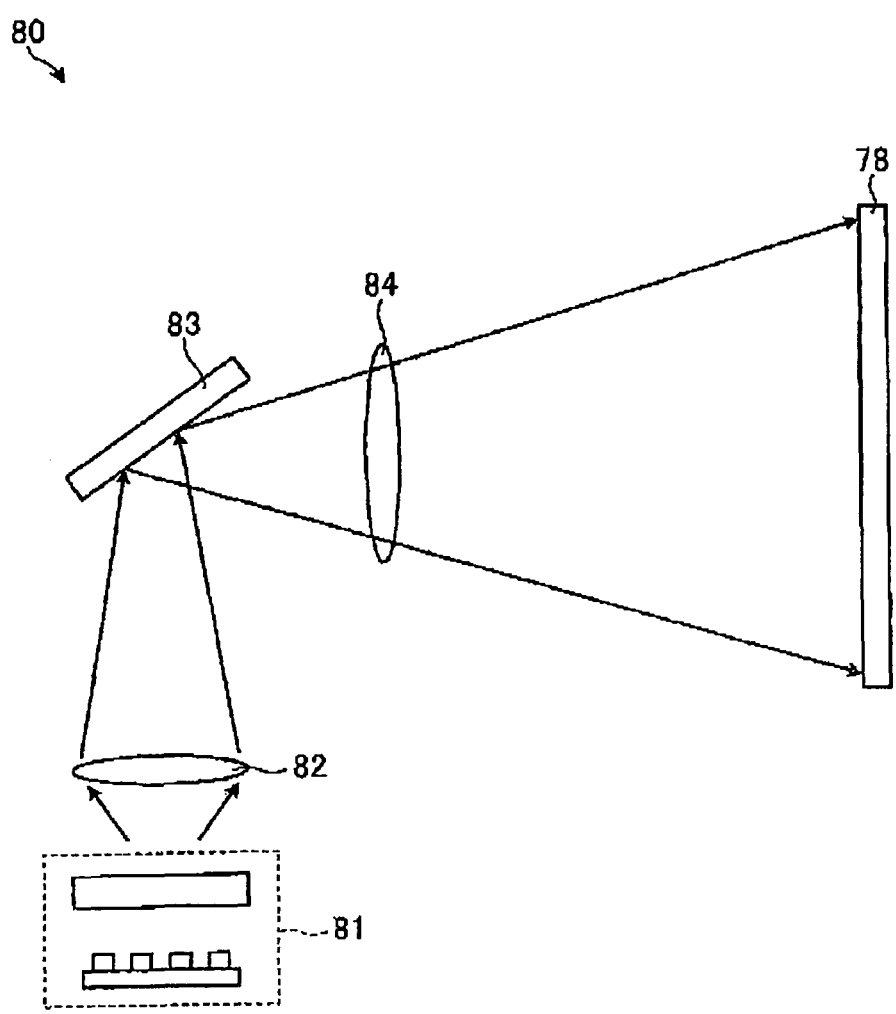
FIG. 15 is a schematic view showing a constitution of a projector of the modified example of a ninth embodiment of the invention.

FIG. 15 schematically shows the constitution of a projector 80 of the modified example of the ninth embodiment.

The projector 80 of the modified example includes a Digital Micromirror Device 83 (DMD) that is a spatial light modulation device.

A light source device 81 has the same constitution as the light source device 10 of the above-described sixth embodiment shown in FIG. 9, and sequentially supplies the R light, the G light, and the B light.

The light which has been emitted from the light source device 81 is incident into the DMD 83 after passing through the condenser lens 82.

The light source device 81 and the condenser lens 82 constitute the illumination device that illuminates the DMD 83 with the light.

The DMD 83 includes a surface onto which each colored light is incident and a plurality of movable mirror elements (now shown) formed on the surface.

The movable mirror elements selectively displace at a first reflection position or a second reflection position.

The DMD 83 modulates each colored light which is sequentially supplied firm the light source device 81.

The light which is reflected toward a projection optical system 84 by the movable mirror element forms a projection image onto the screen 78.

In the constitution of the projector 80, a reflective liquid crystal display device (Liquid Crystal On Silicon:LCOS), a GLV (Grating Light Valve), or the like, may be adopted as spatial light modulation devices.

The projector 80 is not limited to the constitution using a spatial light modulation device.

The projector 80 may be a laser-scanning-type projector in which an image is projected onto a screen by a scanning section such as galvanometer mirror, or the like while emitting the laser light from the light source device.

As image display device may be a so-called rear-projector in which light is supplied onto a first surface of a screen and a viewer observes an image formed by the light emitted from the second surface of screen which is opposite to the first surface.

Furthermore, applications of the light source device of the invention are not limited to an image display device and a monitor.

The light source device of the invention may be used in, for example, an exposure apparatus in which exposures are performed by using the laser light.

As described above, the light source device of the invention is suited to be used in a monitor or image display device.

What is claimed is:

1. A volume hologram comprising:
an incidence surface onto which a first coherent light having a plurality of wavelengths is incident; and
a plurality of interference fringes, each of the plurality of interference fringes having a plurality of streaks, wherein:
each of the plurality of streaks covers substantially an entire area of the incidence surface; and generates a second coherent light comprised of a plurality of wavelengths not identical to that of the first coherent light;
wavelengths of the plurality of wavelengths of the second coherent light generated from the plurality of streaks differ from each other;
angles between the plurality of streaks and the incidence surface are different for each of the plurality of interference fringes, such that each of the plurality of interference fringes corresponds to one wavelength of the coherent light;
the plurality of wavelengths of the second coherent light emits at least from a surface which differs from the incidence surface; and
the first coherent light and the second coherent light travel in a substantially parallel direction.

2. The volume hologram according to claim 1, wherein
the interference fringes include at least a first interference fringe having first streaks, a second interference fringe having second streaks, and a third interference fringe having third streaks,
the angles between the incidence surface and each of the first streaks, the second streaks, and the third streaks are different from each other, and
the angle between the first streaks and the second streaks is identical to the angle between the second streaks and the third streaks.

3. The volume hologram according to claim 1, further comprising:
a first interference fringes group including the plurality of interference fringes having streaks extending in a first direction which extends in the direction substantially perpendicular to the coherent light; and
a second interference fringes group including the plurality of interference fringes having streaks extending in a second direction which intersects with the first direction.

4. A volume hologram comprising:
an incidence surface onto which a first coherent light having a plurality of wavelengths is incident; and
a plurality of interference fringes, each of the plurality of interference fringes having a plurality of streaks, wherein:
each of the plurality of streaks covers substantially an entire area of the incidence surface and generates a second coherent light comprised of a plurality of wavelengths not identical to that of the first coherent light;
wavelengths of the plurality of wavelengths of the second coherent light generated from the plurality of streaks differ from each other;
each of the plurality of streaks is substantially parallel to the incidence surface;
distances between the plurality of streaks are different for each of the plurality of interference fringes, such that each of the plurality of interference fringes corresponds to one wavelength of the coherent light;
the plurality of wavelengths of the second coherent light emits at least from a surface which differs from the incidence surface and;
the first coherent light and the second coherent light travel in a substantially parallel direction.

5. A light source device comprising:
a light source section having a plurality of emission sections and emitting coherent light having a plurality of wavelengths; and
an external resonator causing the coherent light emitted from the light source section to resonate, and having the volume hologram according to claim 4, onto which the coherent light is incident, which has various interference fringes having the streaks whose distances are different from each other corresponding to each wavelength of the coherent light, and which selectively emits each wavelength of the coherent light caused by the interference fringes.

6. The light source device according to claim 5, wherein the volume hologram causes each wavelength of the coherent light incident into the volume hologram to be selectively reflected.

7. The light source device according to claim 5, wherein the volume hologram is formed so that the thickness of the volume hologram is determined based on a space between the plurality of wavelengths of the coherent light which is incident into the volume hologram.

8. The light source device according to claim 5, further comprising
a wavelength conversion element disposed in an optical path between the light source section and the external resonator, and causing each wavelength of the coherent light which has been emitted from the light source section and which is incident into the wavelength conversion element to be converted.

9. The light source device according to claim 8, further comprising
a temperature adjustment section adjusting the temperature of the wavelength conversion element so that the wavelength conversion element has temperature gradients corresponding to the wavelengths of the coherent light which are incident into the wavelength conversion element.

10. An image display device comprising
the light source device according to claim 5, and displaying an image using the light emitted therefrom.

11. A light source device comprising
a light source section having a plurality of emission sections and emitting coherent light having a plurality of wavelengths; and
an external resonator causing the coherent light emitted from the light source section to resonate, and having the volume hologram according to claim 4, onto which the coherent light is incident, which has various interference fringes having the streaks whose distances are different from each other corresponding to each wavelength of the coherent light, and which selectively emits each wavelength of the coherent light caused by the interference fringes.

12. The light source device according to claim 11, wherein the volume hologram causes each wavelength of the coherent light incident into the volume hologram to be selectively reflected.

13. The light source device according to claim 11, wherein the volume hologram is formed so that the thickness of the volume hologram is determined based on a space between the plurality of wavelengths of the coherent light which is incident into the volume hologram.

14. The light source device according to claim 11, further comprising
a wavelength conversion element disposed in an optical path between the light source section and the external resonator, and causing each wavelength of the coherent light which has been emitted from the light source section and which is incident into the wavelength conversion element to be converted.

15. The light source device according to claim 14, further comprising
a temperature adjustment section adjusting the temperature of the wavelength conversion element so that the wavelength conversion element has temperature gradients corresponding to the wavelengths of the coherent light which are incident into the wavelength conversion element.

16. An illumination device comprising
the light source device according to claim 11, and illuminating an object with the light emitted therefrom.

17. A monitor comprising:
the illumination device according to claim 16; and
a capturing section capturing the object which is illuminated with the light emitted from the illumination device.

18. An image display device comprising:
the light source device according to claim 11, and displaying an image using the light emitted therefrom.

19. The volume hologram according to claim 1,
wherein the interference fringes are formed inside the volume hologram and not formed on the incidence surface of the volume hologram.

20. The volume hologram according to claim 1, wherein each of the streaks extends in a plane substantially parallel to the incidence surface.

* * * * *